United States Patent
Ja et al.

(10) Patent No.: US 7,484,196 B2
(45) Date of Patent: Jan. 27, 2009

(54) METHOD FOR ASYNCHRONOUS CLOCK MODELING IN AN INTEGRATED CIRCUIT SIMULATION

(75) Inventors: Yee Ja, Round Rock, TX (US); Bradley S. Nelson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 11/532,582

(22) Filed: Sep. 18, 2006

(65) Prior Publication Data

US 2008/0072197 A1 Mar. 20, 2008

(51) Int. Cl.
*G06F 17/50* (2006.01)
*G06F 9/45* (2006.01)

(52) U.S. Cl. .................................. 716/6; 703/19
(58) Field of Classification Search .................. 716/6; 703/19
See application file for complete search history.

(56) References Cited

U.S. PATENT DOCUMENTS 6,473,890 B1 * 10/2002 Yasui et al. .................... 716/10
2004/0225977 A1 * 11/2004 Akkerman ...................... 716/6
2005/0102643 A1 * 5/2005 Hou et al. ....................... 716/6

* cited by examiner

*Primary Examiner*—Jack Chiang
*Assistant Examiner*—Magid Y Dimyan
(74) *Attorney, Agent, or Firm*—Stephen J. Walder, Jr.; Casimer K. Salys (57) ABSTRACT

Mechanisms for asynchronous clock modeling in an integrated circuit simulation are provided. The mechanisms of the illustrative embodiments provide clock skewing logic for phase shifting a clock signal in an integrated circuit design. This clock skewing logic adds delay to one or more clocks of an integrated circuit design to thereby place that clock out of phase with other clocks in the integrated circuit design. In one illustrative embodiment, delay is introduced into a clock net in an increasing manner with each enablement of the clock skewing logic. In another illustrative embodiment, the introduced delay is increased and decreased within a window from no phase shift of the clock net up to a maximum phase shift of the clock net. Once the maximum phase shift is reached, the amount of delay introduced is decreased with subsequent enablement of the clock skewing logic.

7 Claims, 4 Drawing Sheets

METHOD FOR ASYNCHRONOUS CLOCK MODELING IN AN INTEGRATED CIRCUIT SIMULATION

BACKGROUND

1. Technical Field

The present application relates generally to an improved data processing system and method. More specifically, the present application is directed to a system and method for asynchronous clock modeling in an integrated circuit simulation.

2. Description of Related Art

Electronic design automation (EDA) is now commonly used in the design of integrated circuits. EDA makes extensive use of computers to automate the design process. Once a circuit has been designed and physically laid out, extensive testing is performed to verify that the new design and layout will work as desired. Testing of the new design is typically performed by simulating the design using a computer, which permits relatively fast verification of the circuit without necessitating physically placing the design in silicon.

Static analysis and dynamic simulation are two primary conventional methods employed to analyze and verify circuit behaviors of a design. Dynamic simulation provides a relatively close approximation of actual operation of a circuit design but requires extensive time and resources to perform. Static analysis requires less time and resources to perform, but has limitations with regard to the information that may be obtained.

A major problem exists in current dynamic simulation of integrated circuits in that all clocks of the integrated circuit simulation, even those which are asynchronous with respect to one another, appear to be synchronous during simulation. Thus, the simulation does not adequately represent the actual operation of the integrated circuit device when it is fabricated in hardware.

In hardware, clocks of the integrated circuit device rarely operate in a completely synchronous manner. To the contrary, asynchronous clocking of the logic is much more frequent in integrated circuits. Thus, while in simulation different independently driven clock logic is modeled as being in phase with one another, the clock logic of the actual hardware that is generated based on the integrated circuit device will typically go out of phase during operation.

The synchronous behavior of clocks which are supposed to be asynchronous with one another occurs because clocks do not walk through the logic of the integrated circuit design in an asynchronous manner with respect to one another in simulation unless they are made to do so. This means that one or all of the clocks in the integrated circuit simulation must be generated externally from the integrated circuit model, e.g., via code driving the simulation or by externally manipulating the clock signals of the integrated circuit simulation.

While external control of the clocks may allow one to force an asynchronous operation within the simulation, there currently is no mechanism that allows one to limit the asynchronous clock phases to phase differences of interest. To explain this further, it should be kept in mind that clock skewing is typically used in conjunction with data skewing at asynchronous crossing. For example, assume that random propagation delays are inserted across an asynchronous boundary crossing. Assume, for example, that the clock period of the send side of the asynchronous boundary is 10 simulation cycles and the clock period of the receive side of the asynchronous boundary is 1000 simulation cycles. Further assume that the minimum latency of signals is 0 and the maximum latency of signals is 2 simulation cycles across the asynchronous boundary.

With the above assumptions, one will have a 2 (maximum latency-minimum latency) in 1000 (receive side's clock period) chance of capturing a data skewed value in the receive side's clock domain during simulation. In other words, if a test of the integrated circuit device requires 1000 simulation or clock cycles to complete, the chance of capturing a data skewed value within the test period is only 0.2 percent. Hence, if data capture is performed at particular points during the test, there is only a 0.2 percent chance that the data capture will capture a skewed data value. This problem is made even greater when the test of the integrated circuit device requires a larger number of clock or simulation cycles to complete.

Thus, with the known systems for testing the operation of integrated circuit designs, either the clocks of the integrated circuit design are synchronous, their phase difference is static, or if there is a non-static phase difference, the testing allows the phase difference to drift out of a range of interest thereby reducing the chance of capturing a data skewed value within the testing period.

SUMMARY

In one illustrative embodiment, a method, in a data processing system, for simulating asynchronous clock nets in an integrated circuit model is provided. The method comprises receiving the integrated circuit model and transforming at least one clock net in the integrated circuit model to include clock skewing logic. The method further comprises simulating the integrated circuit model having the transformed at least one clock net and generating an output indicative of an operation of the integrated circuit model during the simulation.

The clock skewing logic introduces delay into the at least one clock net to thereby skew a phase of the at least one clock net with respect to another clock net in the integrated circuit model. The clock skewing logic comprises a delay counter and a plurality of latches, coupled to the delay counter, and provided in series, each latch introducing an additional delay amount to an input clock signal. An output of a particular latch in the plurality of latches is selected as a clock output signal based on an incrementing of the delay counter with each enablement of the clock skewing logic. The clock skewing logic simulates an asynchronous operation of the at least one clock net with respect to the another clock net during the simulation of the integrated circuit model.

In another illustrative embodiment, a method, in a data processing system, for simulating asynchronous clock nets in an integrated circuit model is provided. The method comprises receiving the integrated circuit model and transforming at least one clock net in the integrated circuit model to include clock skewing logic. The method further comprises simulating the integrated circuit model having the transformed at least one clock net and generating an output indicative of an operation of the integrated circuit model during the simulation.

The clock skewing logic introduces delay into the at least one clock net to thereby skew a phase of the at least one clock net with respect to another clock net in the integrated circuit model. The clock skewing logic simulates an asynchronous operation of the at least one clock net with respect to the another clock net during the simulation of the integrated circuit model. The clock skewing logic introduces delay amounts into the at least one clock net between a minimum phase shift amount and a maximum phase shift amount.

Moreover, the clock skewing logic increases a delay amount introduced into the at least one clock net with each enablement of the clock skewing logic up to the maximum phase shift amount. In addition, the clock skewing logic decreases a delay amount introduced into the at least one clock net with each subsequent enablement of the clock skewing logic following reaching the maximum phase shift amount.

In yet another illustrative embodiment, a method, in a data processing system, for simulating asynchronous clock nets in an integrated circuit model is provided that comprises receiving the integrated circuit model, transforming at least one clock net in the integrated circuit model to include clock skewing logic, simulating the integrated circuit model having the transformed at least one clock net, and generating an output indicative of an operation of the integrated circuit model during the simulation. The clock skewing logic introduces delay into the at least one clock net to thereby skew a phase of the at least one clock net with respect to another clock net in the integrated circuit model. The clock skewing logic simulates an asynchronous operation of the at least one clock net with respect to another clock net during the simulation of the integrated circuit model. Moreover, the clock skewing logic comprises a phase shift direction selection portion that determines whether to increase or decrease an amount of delay introduced into the at least one clock net.

These and other features and advantages of the present invention will be described in, or will become apparent to those of ordinary skill in the art in view of, the following detailed description of the illustrative embodiments of the present invention.

Thus, the clock skewing logic above provides a mechanism for simulating asynchronous clocks from within the integrated circuit design or model. With this illustrative embodiment, care must be taken when performing the simulation to not exceed the number of delays provided by the number of latches. That is, the number of latches used in the simulation limits the amount of delay that can be introduced into the clock signal. Thus, it is important to have as many latches in the clock skewing logic as is required for the amount of delay that one wishes to use in the simulation.

Alternatively, one needs the number of delay latches to be equivalent to the clock period to be skewed. With such an embodiment, the clock delay operation may be wrapped back to a first latch since a clock waveform is repeating. As a result, the limitation on the number of times the clock may be delayed, or skewed, that is present in the above embodiment is eliminated by use of this alternative embodiment in which the number of delay latches is equivalent to the clock period.

In another illustrative embodiment, a more generic clock skewing logic is provided which allows one to phase shift a clock signal within a defined window. With this alternative illustrative embodiment, the number of delay latches required is equal to a maximum phase shift desired and there is no dependence on the clock period. Moreover, there is no limitation on the number of times this alternative clock skewing logic may be enabled.

With this alternative illustrative embodiment, clock skewing logic is provided that allows a window of phase shifts to be established and allows the phase shifting to cycle back and forth through this window from a initial value of the window to a maximum value of the window and vice versa. The clock skewing logic of this alternative embodiment may be user enabled during simulation, randomly enabled during simulation, enabled periodically during simulation, or even enabled for the duration of the entire simulation.

The clock skewing logic of this alternative embodiment includes an enablement portion, a phase shift direction selection portion, and a phase shifting portion. The enablement portion of the clock skewing logic determines when to enable the clock skewing through the window of phase shifts. Every time the enablement portion of the clock skewing logic asserts an enablement signal, the phase of the clock net is first increased, by the phase shifting portion until a maximum phase shift amount is reached. After the maximum phase shift amount is reached, subsequent assertions of the enablement signal to the phase shifting portion causes the phase of the clock to be decreased until the phase shift amount is 0. The determination as to whether to increment or decrement the phase shift of the clock is performed by the phase shift direction selection portion of the clock skewing logic. This increment/decrement cycle can be continuously repeated as often as desired during the simulation. There is no dependence on clock period nor is there a limitation on the number of times the clock skewing logic may be enabled.

Thus, with this alternative illustrative embodiment, if an integrated circuit design or model has two clocks which are asynchronous with one another, the clock skewing logic may simulate this asynchronous nature of the two clocks. This simulation of the asynchronous nature of the two clocks is facilitated by transforming the logic of one clock net using the clock skewing logic described above. During simulation, when the clock skewing logic is enabled, it will appear that the two clocks experience a phase shift offset from between 0 and a maximum phase shift amount, and then back again, from the initial phase shift of the two clocks. Thus, the asynchronous nature of the clock signals is simulated from within the integrated circuit model without requiring external control of the clock signals.

In one illustrative embodiment, a method is provided for simulating asynchronous clock nets in an integrated circuit model. The method may comprise receiving the integrated circuit model and transforming at least one clock net in the integrated circuit model to include clock skewing logic. The clock skewing logic may introduce delay into the at least one clock net to thereby skew a phase of the at least one clock net with respect to another clock net in the integrated circuit model. The method may further comprise simulating the integrated circuit model having the transformed at least one clock net. The clock skewing logic may simulate an asynchronous operation of the at least one clock net with respect to the another clock net during the simulation of the integrated circuit model. The method may further comprise generating an output indicative of an operation of the integrated circuit model during the simulation.

The clock skewing logic may introduce delay amounts into the at least one clock net between a minimum phase shift amount and a maximum phase shift amount. The clock skewing logic may comprise a delay counter and a plurality of latches, coupled to the delay counter, and provided in series, each latch introducing an additional delay amount to an input clock signal. An output of a particular latch in the plurality of latches may be selected as a clock output signal based on an incrementing of the delay counter with each enablement of the clock skewing logic.

The clock skewing logic may increase a delay amount introduced into the at least one clock net with each enablement of the clock skewing logic up to the maximum phase shift amount. The clock skewing logic may decrease a delay amount introduced into the at least one clock net with each subsequent enablement of the clock skewing logic following reaching the maximum phase shift amount.

The clock skewing logic may include enablement logic for enabling the clock skewing logic. The enablement logic may comprise one of a user driven net or automatic enablement logic. The automatic enablement logic may include one of logic for periodically enabling the clock skewing logic or logic for randomly enabling the clock skewing logic.

The clock skewing logic may comprise a phase shift direction selection portion that determines whether to increase or decrease an amount of delay introduced into the at least one clock net. The phase shift direction selection portion may assert a signal along one of a plurality of select signal lines to a multiplexer. The multiplexer may receive outputs from each latch in a plurality of latches provided in series such that each latch adds an incremental delay amount to an output signal from a previous latch in the plurality of latches or an input clock signal. The multiplexer may select an output from a latch in the plurality of latches as an output clock signal based on the signal asserted by the phase shift direction selection portion.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, an apparatus is provided. The apparatus may comprise a processor and a memory coupled to the processor. The memory may comprise instructions which, when executed by the processor, cause the processor to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a mechanism for providing clock skewing logic for implementing asynchronous clock modeling from within an integrated circuit design or model. The mechanisms of the illustrative embodiments allow one or more clock nets to be transformed in an integrated circuit design to include clock skewing logic for simulating asynchronous clocks in the integrated circuit design. As a result, a more accurate simulation of the resulting hardware is achieved as opposed to conventional simulation in which clocks are simulated in a manner that makes them appear to be synchronous.

The illustrative embodiments may be implemented in a single data processing system or may be distributed across a plurality of data processing systems that are coupled to one another via one or more communications networks. For example, a server computing device may provide circuit model simulation and analysis engines that may be applied to integrated circuit designs or models provided by other computing devices, such as client computing devices. A client computing device may communicate with the server computing device via the one or more communications networks so as to control the application of simulation and analysis engines of the illustrative embodiments to the integrated circuit models, which may be provided as netlist data structures, for example. Alternatively, the integrated circuit models and analysis engines may be provided entirely on the same computing device such that multiple computing devices and communication networks are not necessary. For purposes of the present description, however, it will be assumed that the illustrative embodiments are implemented in a distributed data processing system.

Figure 1:
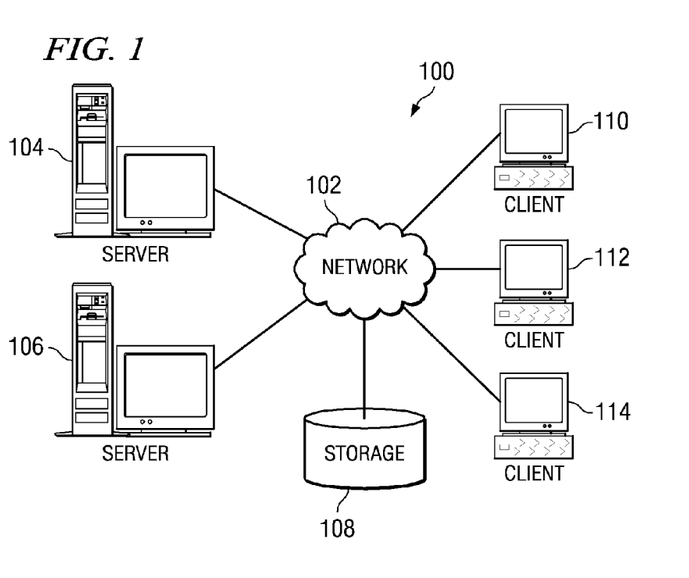
FIG. 1 is an exemplary block diagram of a distributed data processing system in which aspects of the illustrative embodiments may be implemented.
Figure 2:
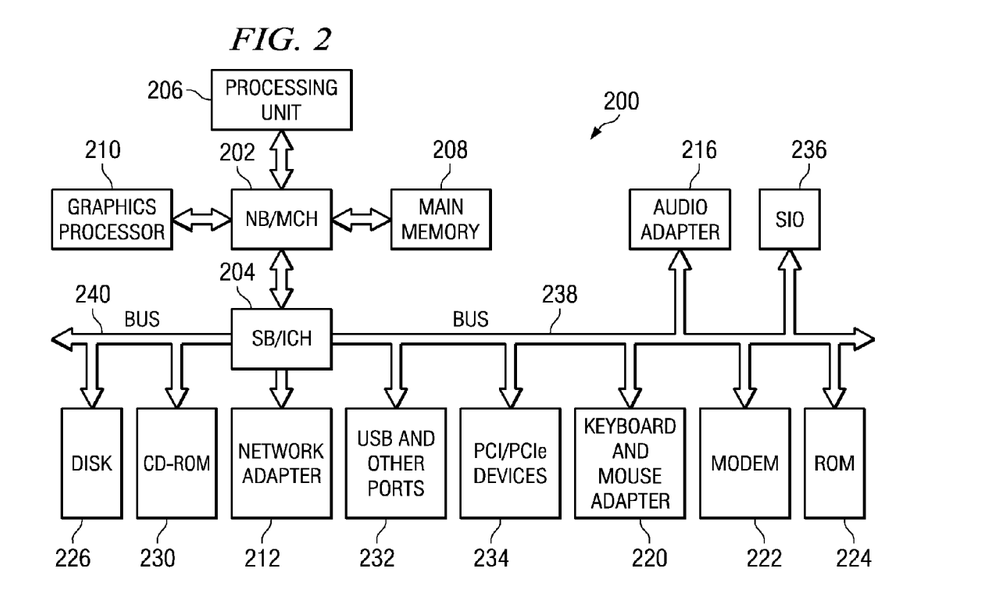
FIG. 2 is a block diagram of an exemplary data processing device in which exemplary aspects of the illustrative embodiments may be implemented.

With reference now to the figures and in particular with reference to FIGS. 1-2, exemplary diagrams of data processing environments are provided in which exemplary embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NE/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments provide a system and method for asynchronous clock modeling in an integrated circuit simulation. For example, with reference again to FIG. 1, the server 104 may provide a circuit simulation engine in accordance with the mechanisms of the illustrative embodiments. A client computing device, such as client 110, may provide a circuit model to the server 104 upon which the simulation engine of server 104 is to operate in order to verify the design of the circuit. This circuit model may comprise, for example, a netlist data structure defining the various nets of the circuit model as well as other information, generally known in the art, regarding clock phases, clock periods, data signal information, and the like.

It should be appreciated that while the illustrative embodiments will be described with regard to nets in a netlist data structure, the present invention is not limited to use of a netlist data structure. Rather, other types of data structures that provide a logic description representative of a circuit design may be used without departing from the spirit and scope of the present invention. For example, a hardware description language data structure may be used to provide the necessary information for performing simulation of a circuit model.

The mechanisms of the illustrative embodiments provide clock skewing logic for phase shifting a clock signal in an integrated circuit design. Thus, the illustrative embodiments provide logic for imposing clock skew from inside the integrated circuit design. The clock skewing logic may be used to transform one or more clock nets in the circuit model to a skewed clock net in the simulation. The particular clock nets that are transformed by this clock skewing logic may be selected based on information, e.g., clock phase and/or periodicity information, in the clock model identifying clocks that are asynchronous to one another. One or more of these asynchronous clocks may be selected to be transformed into a skewed clock net such that the asynchronous nature of the clocks may be reflected in the simulation performed by the simulation engine.

The clock skewing logic adds delay to one or more clock nets of an integrated circuit design, or model, to thereby perform phase shifts to place that clock net out of phase with other clock nets in the integrated circuit design or model (hereafter simply referred to as an integrated circuit model). The initiation of such clock skewing may be user driven, e.g., via a user driven net, or automatically performed, such as in a periodic manner as specified by logic in the integrated circuit model.

Figure 3:
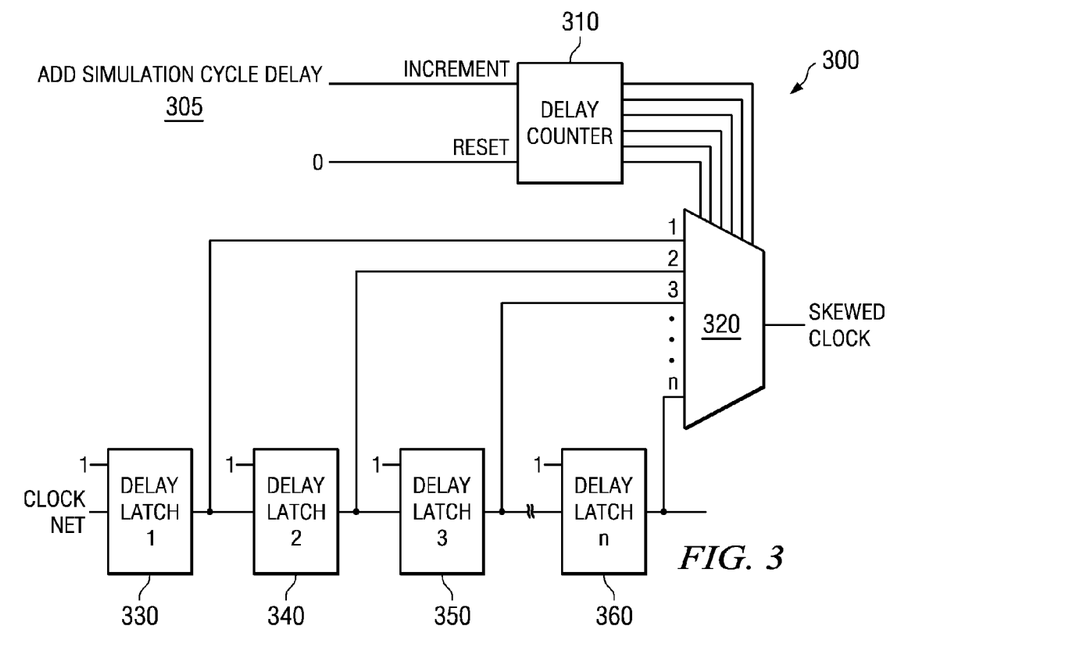
FIG. 3 is an exemplary diagram of clock skewing logic in accordance with a first illustrative embodiment.

FIG. 3 is an exemplary diagram of clock skewing logic in accordance with a first illustrative embodiment. In this illustrative embodiment, the clock skewing logic 300 includes a delay counter 310, a multiplexer 320, and a plurality of delay latches 330-360. The delay counter 310 increments with each assertion of the "Add Simulation Cycle Delay" 305 input signal, which may be provided by user input or by other user defined logic, to the delay counter 310 and is reset with an assertion of a reset signal on the reset input line. As the delay counter 310 increments, a different select signal line 315 is selected for the assertion of a select signal to the multiplexer 320.

The select signal along the selected signal line 315 causes the multiplexer 320 to select a corresponding input from a delay latch 330-360. The delay latches 330-360 are provided in series such that the output from each delay latch 330-360 adds an additional incremental delay to a clock signal of the clock net 325 input to the series of delay latches 330-360. Thus, for example, each delay latch 330-360 may apply a clock phase delay of Δclock to the clock input signal from the clock net 325. As a result, the output clock signal from delay latch 330 may have a phase of 1+Δclock, the output clock signal from delay latch 340 may have a phase of 1+(2*Δclock), and so forth.

Thus, the select signal along the selected signal line 315 specifies which delay latch's output is to be selected for output by the multiplexer 320 and thereby selects an amount of delay to be added to the input clock signal along clock net 325. For example, if the "Add Simulation Cycle Delay" has been asserted once, the delay counter 310 increments to a first value and asserts a signal along a first one of the select signal lines 315. This select signal along the first select signal line 315 corresponds to a selection of an input to the multiplexer 320 from a first delay latch 330. Hence the skewed clock output 365 will have a clock phase of 1+Δclock. For the next assertion of the "Add Simulation Cycle Delay" signal 305, the input from delay latch 340 will be selected by the multiplexer 320 and the skewed clock output 365 will have a phase of 1+(2*Δclock).

Thus, with each increment of the delay counter, up to a maximum number of times the Add Simulation Cycle Delay input is to be asserted during a simulation, a delay latch later in the series of delay latches is selected. Hence, with each assertion of the Add Simulation Cycle Delay signal 305, the amount of the delay added to the clock is increased up to a maximum value. As a result, the delayed clock signal becomes more and more out of phase with other clock signals of the integrated circuit design.

The clock skewing logic 300 of FIG. 3 may be used to transform one or more clock nets in the integrated circuit model provided to the simulation engine. That is, the integrated circuit model may be examined to identify the clock signals and determine which clock nets are asynchronous to one another, e.g., based on phase and/or periodicity information provided in the integrated circuit model. One or more of the asynchronous clock nets may be selected for transformation using the clock skewing logic 300 of FIG. 3. The selected clock nets then have the clock skewing logic 300 added to them so as to impart the functionality described above to the clock net during simulation of the integrated circuit. Appropriate inputs, such as the "Add Simulation Cycle Delay" signal, may be specified for controlling the manner by which the clock skewing logic 300 operates during simulation. These inputs may be controlled by the user via a user directed net, or automatically via other logic included in the integrated circuit model.

Thus, the clock skewing logic shown in FIG. 3 above provides a mechanism for simulating asynchronous clocks from within the integrated circuit design or model. With this embodiment of clock skewing logic, however, care must be taken when performing the simulation to not exceed the number of delays provided by the number of delay latches 330-360 in order to ensure proper operation of the simulation. Thus, it is important to have as many delay latches 330-360 in the clock skewing logic 300 as is required for the amount of delay that one wishes to use in the simulation. Alternatively, one needs the number of delay latches 330-360 to be equivalent to the clock period to be skewed. As a result, a large number of delay latches 330-360 may be required in order to provide that amount of delay desired during simulation. Furthermore, the amount of delay that may be added is limited to the number of delay latches provided.

Figure 4:
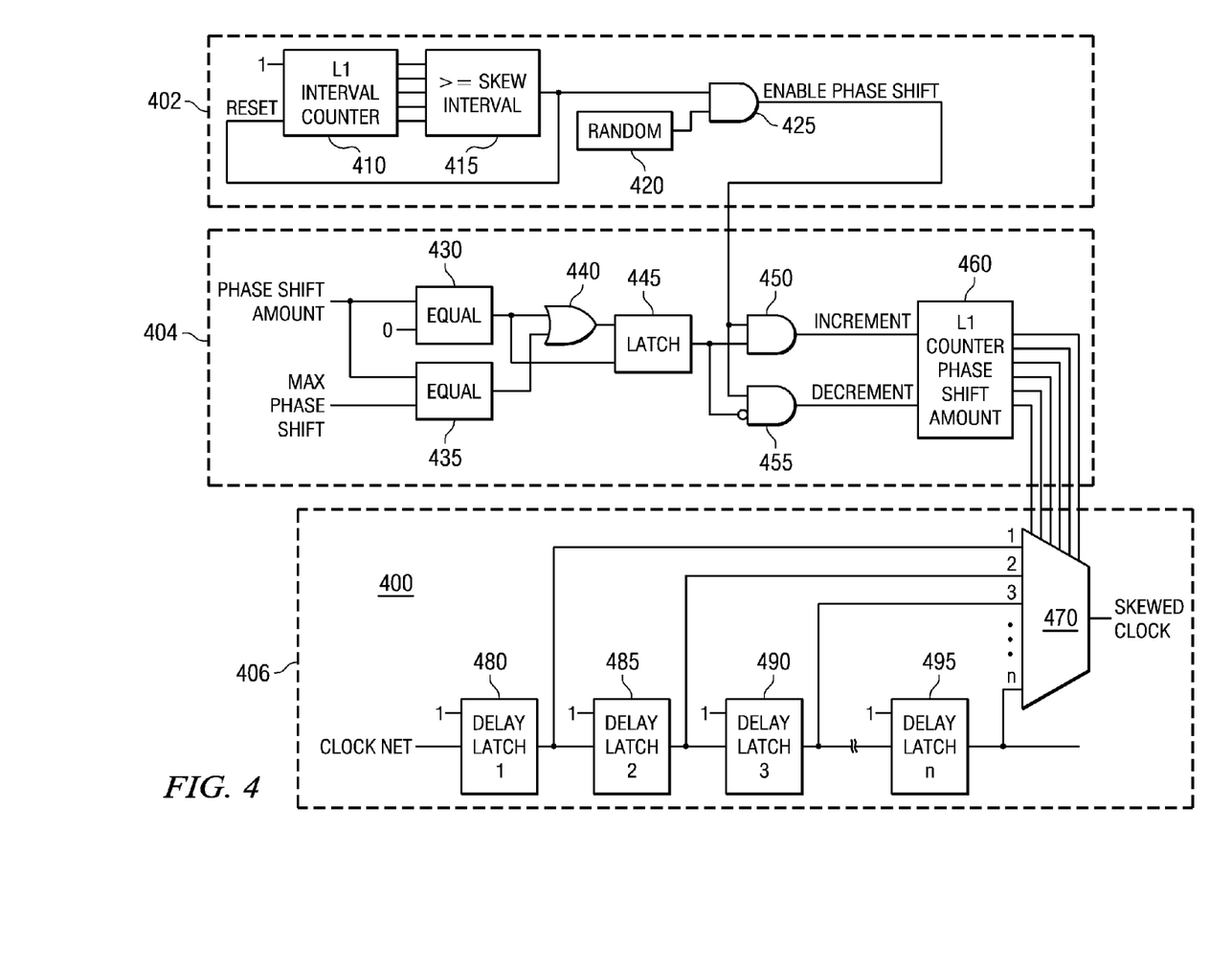
FIG. 4 is an exemplary diagram of clock skewing logic in accordance with a second illustrative embodiment.

To address these problems, an alternative illustrative embodiment of the clock skewing logic has been developed that is more generic than that shown in FIG. 3 and allows one to perform phase shifts of a clock signal within a defined window of phase shifts. This alternative illustrative embodiment of the clock skewing logic is illustrated in FIG. 4 The clock skewing logic of this alternative embodiment may be user enabled during simulation, automatically and randomly enabled during simulation, automatically enabled periodically during simulation, or even enabled for the duration of the entire simulation.

The clock skewing logic 400 of this alternative embodiment includes an enablement portion 402, a phase shift direction selection portion 404, and a phase shifting portion 406. The enablement portion 402 of the clock skewing logic determines when to enable the clock skewing through the window of phase shifts. The phase shift direction selection portion 404 determines whether to increase or decrease the amount of delay added to the input clock signal of the clock net 475 based on whether a maximum or minimum phase shift amount is reached by the phase shifting portion 406. The phase shifting portion 406 performs the actual phase shifting of the input clock signal from the clock net 475 by adding delay to the clock signal via the series of delay latches 480-495.

With this clock skewing logic 400, every time the enablement portion of the clock skewing logic asserts an enablement signal, the phase of the clock net is first increased, by the phase shifting portion until a maximum phase shift amount is reached. After the maximum phase shift amount is reached, subsequent assertions of the enablement signal to the phase shifting portion causes the phase of the clock to be decreased until the phase shift amount is 0. The determination as to whether to increment or decrement the phase shift of the clock is performed by the phase shift direction selection portion of the clock skewing logic.

With this alternative illustrative embodiment, the number of delay latches required to implement the phase shifting portion 406 is equal to a maximum phase shift desired and there is no dependence on the clock period. Furthermore, there is no limitation on the number of times this alternative clock skewing logic may be enabled, as there is in the embodiment illustrated in FIG. 3. That is, this increment/decrement cycle can be continuously repeated as often as desired during the simulation.

The enablement portion 402 may take many different forms depending upon the selected method for enabling the skewing of clock signals in the simulation of the integrated circuit model. For example, the enablement portion 402 may be comprised of a user directed net upon which signals are asserted at the direction of the user to thereby enable clock skewing. Alternatively, logic may be provided in the integrated circuit model for automatically enabling clock skewing in accordance with parameters of the simulation and/or inputs from the user. For example, logic may be provided in the enablement portion 402 for periodically enabling the clock skewing logic.

In the depicted example, logic is provided as part of the enablement portion 402 for randomly enabling the clock skewing logic 400 during simulation. As shown in FIG. 4, this exemplary embodiment of the enablement portion 402 includes an L1 interval counter 410, a determination block 415 for determining if the L1 interval counter value is greater than or equal to a skew interval, a random value generator 420, and an AND gate 425. The L1 interval counter counts a simulation cycle interval between attempts to perform clock skewing. That is, for example, a user may wish to impose a skew interval of 5 simulation cycles between attempts to perform clock skewing of the clock input signal. The L1 interval counter 410 may count these 5 simulation cycles at which point the determination block 415 outputs a logic 1 value to the AND gate 425 and to the reset input of the L1 interval counter 410. As a result, the L1 interval counter 410 is reset.

The AND gate 425 receives the output signal from the determination block 415 as an input along with a random input from the random value generator logic 420. The random value generator logic 420 randomly, or pseudo-randomly, determines whether to output a logic 1 or a logic 0. If both the determination block 415 and the random value generator logic 420 output a logic 1, or if both output a logic 0, the AND gate 425 asserts the enable phase shift signal, i.e. outputs a logic 1, to the AND gates 450 and 455 of the phase shift direction selection portion 404.

The phase shift direction selection portion 404 includes equal determination logic blocks 430 and 435, an OR gate 440, a latch 445, AND gates 450 and 455, and a L1 counter phase shift amount logic block 460. The equal determination logic block 430 receives a 0 input and a phase shift amount input 428 which is provided by a feedback loop (not shown) from the L1 counter phase shift amount logic block 460. The equal determination logic block 430 determines if the phase shift amount input 428 is equal to 0 or not. In essence, the equal determination logic block 430 determines if the phase shift of the clock signal is at a minimum edge of the phase shift window, i.e. 0 phase shift.

The equal determination logic block 435 receives the phase shift amount input 428, from the feedback loop (not shown) from the L1 counter phase shift amount logic block 460, and a maximum phase shift input 432, which may be a user specified value. The equal determination logic block 435 determines if the current phase shift amount input 428 is equal to a maximum phase shift amount specified by the maximum phase shift input 432. Essentially, the equal determination logic block 435 operates to determine if the phase shift of the clock signal has reached a maximum edge of the phase shift window.

With both equal determination logic blocks 435, if the inputs are equal, then an output signal is asserted to the OR gate 440. The output of equal determination logic block 430 is also provided as an input to latch 445. Thus, when either of the outputs from logic blocks 430 and 435 is a logic 1, the OR gate 440 outputs a logic 1 to the latch 445. When the phase shift amount equals 0, the logic block 430 outputs a logic 1 to the latch 445, otherwise the logic block 430 outputs a logic 0. As a result, when the phase shift amount equals 0, the latch 445 latches in a 1 value. When the phase shift amount equals a maximum phase shift amount, the latch 445 latches in a 0 value.

The latch 445 outputs its store value to AND gates 450 and 455. This output is inverted at the input of AND gate 455. Thus, when the latch 455 stores a logic 1 value, and the enable phase shift signal is asserted, the AND gate 450 outputs an increment signal to the L1 counter phase shift amount logic 460. When the latch 445 stores a logic 0 value, and the enable phase shift signal is asserted, the AND gate 455 asserts a decrement signal to the L1 counter phase shift amount 460. Based on either the increment or decrement signal, the L1 counter phase shift amount 460 either increments or decrements a count amount and thereby asserts a signal on a corresponding select signal line 465 to the multiplexer 470 in the phase shifting portion 406. In this way, the shifting of phase of the clock signal may be either incremented or decremented depending upon whether a maximum or minimum phase shift amount has been reached.

The phase shifting portion 406 operates in essentially the same manner as described above with regard to FIG. 3. That is, based on the selection signal received from the L1 counter phase shift amount logic block 460, the multiplexer outputs a corresponding selected input signal from one of the delay latches 480-495 as the skewed clock output 498. A key difference between this embodiment and the embodiment of FIG. 3 being that the selection signals may be incremented and decremented and thus, the selection of output signals from delay latches 480-495 may both cause increased delay or reduced delay, depending on whether the selection signals are incremented or decremented. As a result, a window of delayed clock signals is established between 0 delay or phase shift and a maximum delay or phase shift.

Thus, with this alternative illustrative embodiment, if an integrated circuit design or model has two clocks which are asynchronous with one another, the clock skewing logic may simulate this asynchronous nature of the two clocks. This simulation of the asynchronous nature of the two clocks is facilitated by transforming the logic of one clock net, e.g., clock net 475, using the clock skewing logic 400 described above. During simulation, when the clock skewing logic is enabled, it will appear that the two clocks experience a phase shift offset from between 0 and a maximum phase shift amount, and then back again, from the initial phase shift of the two clocks. Thus, the asynchronous nature of the clock signals is simulated from within the integrated circuit model without requiring external control of the clock signals.

Figure 5:
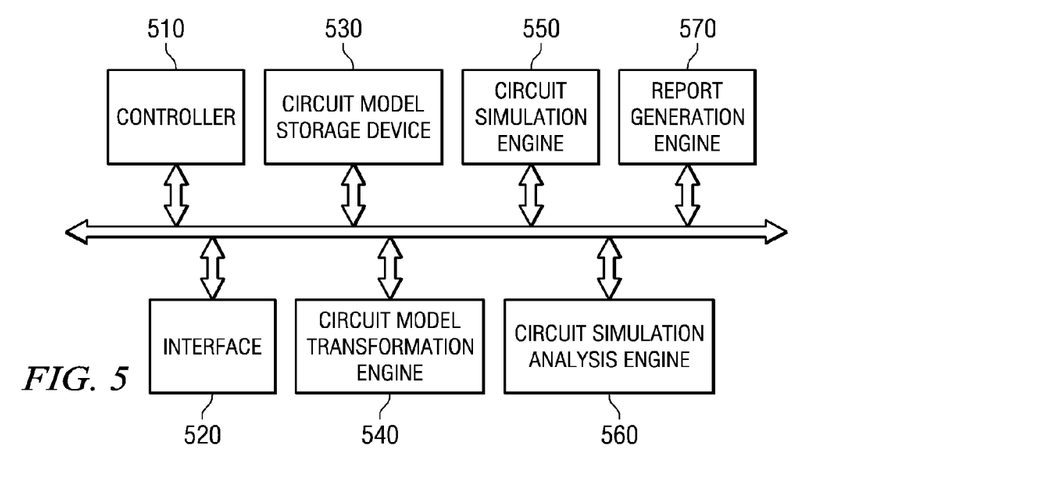
FIG. 5 is an exemplary block diagram of the primary operational elements of a circuit simulation system in accordance with one illustrative embodiment.

FIG. 5 is an exemplary block diagram of the primary operational elements of a circuit simulation system in accordance with one illustrative embodiment. As shown in FIG. 5, the circuit simulation system 500 includes a controller 510, an interface 520, a circuit model storage device 530, a circuit model transformation engine 540, a circuit simulation engine 550, a circuit simulation analysis engine 560, and a report generation engine 570. The elements 510-570 may be implemented in hardware, software, or any combination of hardware and software. In one illustrative embodiment, the elements 510-570 are implemented as software instructions executing on one or more data processing devices.

The controller 510 controls the overall operation of the circuit simulation system 500 and orchestrates the operation of the other elements 520-570. The interface 520 provides a communication interface through which integrated circuit model information may be received from other applications and/or other computing devices. The interface 520 may be a network interface through which integrated circuit model information may be received from one or more client devices and results of simulation may be provided to the one or more client devices. The interface 520 may also be an interface through which user input is received to configure simulations performed by the circuit simulation system 500.

The circuit model storage device 530 stores the integrated circuit model information obtained through the interface 520 for use in performing simulation. This circuit model information may include, for example, one or more netlist data structures specifying the nets of the integrated circuit model, phase and/or periodicity information of clock signals of the integrated circuit model, as well as other information that typically makes up an integrated circuit model as is generally known in the art.

The circuit model transformation engine 540 operates on the integrated circuit model in the circuit model storage device 530 to transform one or more clock nets in the integrated circuit model so as to simulate the asynchronous nature of the one or more clock nets relative to other clock nets in the integrate circuit model. As discussed above, the selection of the one or more clock nets to transform may be performed, for example, based on the phase and/or periodicity information for the clock nets received as part of the integrate circuit model. Alternatively, a user may specify one or more clock nets to transform via user input to the circuit simulation system 500 via the interface 520.

The transformation that is performed on the selected one or more clock nets is to modify the logic of the clock nets to include the clock skewing logic from one of FIG. 3 or 4, depending upon the desired implementation. Via the clock skewing logic, delay is selectively introduced into the selected one or more clock nets to thereby place those clock nets out of phase with other clock nets of the integrated circuit model during simulation. Thus, rather than the clocks synchronously stepping along through the simulation, at certain simulation cycles, delay is introduced into a selected set of the clock nets to thereby cause them to no longer be synchronous with the other clock nets in the integrated circuit model. In this way, the asynchronous operation of the clock nets is modeled in the simulation of the integrate circuit model itself without the need for external generation the clocks.

The circuit simulation engine 550 performs simulation of the transformed integrated circuit model that includes the clock skewing logic for the selected one or more clock nets. Based on the enablement logic of the clock skewing logic, delay is introduced into the selected one or more clock nets during the simulation, as described above. Thus, the asynchronous clock nets are simulated during the simulation of the integrated circuit model.

The circuit simulation analysis engine 560 analyzes the results of the circuit simulation in a manner generally known in the art. This analysis may identify problems in the behavior of the integrated circuit model based on specified desired operational behavior, for example, so that notifications may be generated for informing a human designer of areas where the integrated circuit model may need to be modified. The report generation engine 570 may generate such reports for output to user, such as via the interface 520 to a client device, for example. The analysis of simulation results and generation of reports is generally known in the art.

Figure 6:
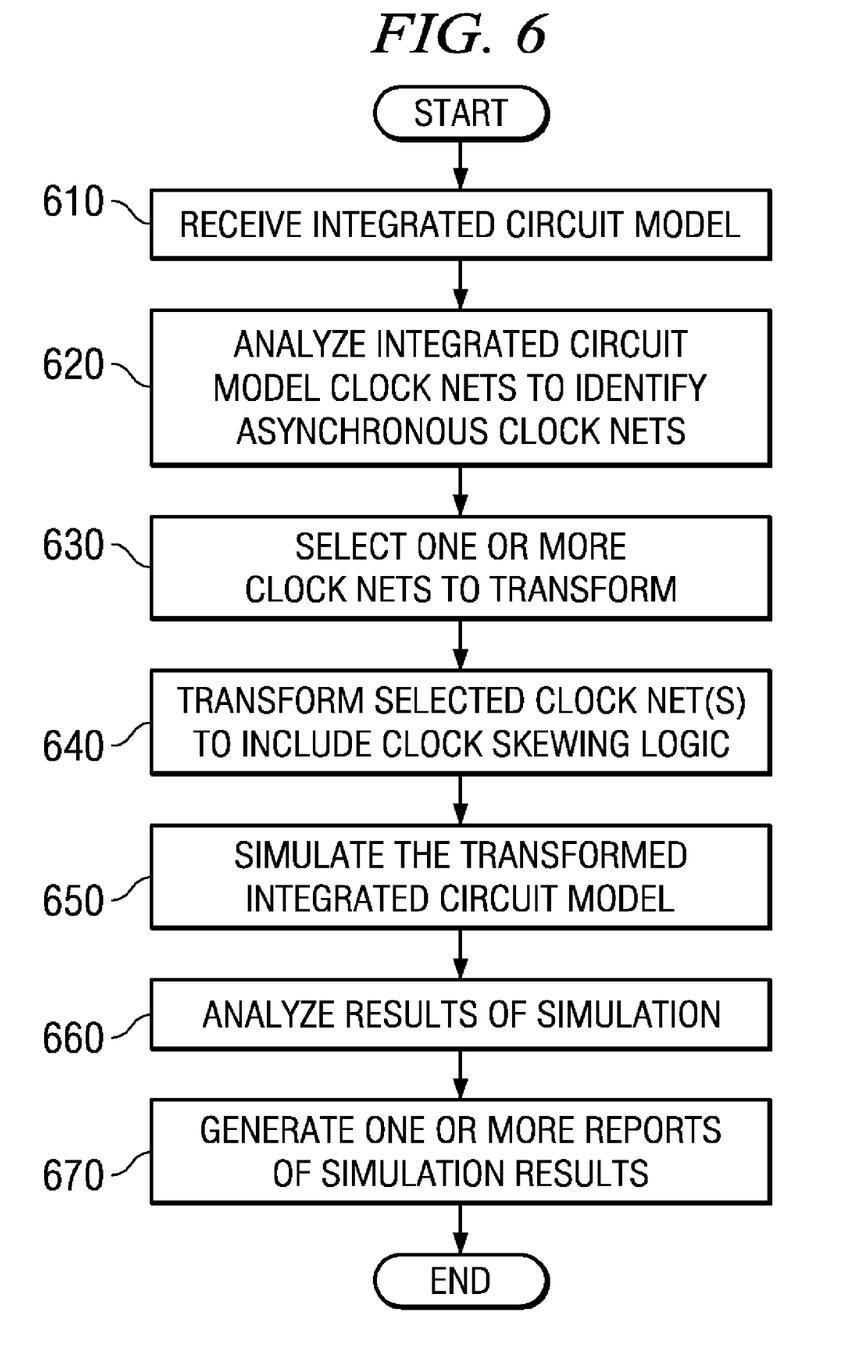
FIG. 6 is a flowchart outlining an operation for performing a simulation of an circuit model in accordance with one illustrative embodiment.

FIG. 6 is a flowchart outlining an operation for performing a simulation of an integrated circuit model in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 6, the operation starts by the circuit simulation system receiving an integrated circuit model (step 610). The circuit simulation system analyzes the integrated circuit model clock nets to identify asynchronous clock nets (step 620). The circuit simulation system selects one or more asynchronous clock nets for transformation (step 630). The circuit simulation system transforms the selected clock nets to include clock skewing logic (step 640). The circuit simulation system simulates the transformed integrated circuit model (step 650). The circuit simulation system analyzes the results of the simulation of the transformed integrated circuit model (step 660) and generates one or more reports for informing a user of results of the simulation (step 670). The operation then terminates.

Thus, the illustrative embodiments provide a mechanism by which asynchronous clock behavior is simulated within the integrated circuit model. The illustrative embodiments transform clock nets in the integrated circuit model to include clock skewing logic for causing the simulation of the integrated circuit model to simulate the clock nets as being asynchronous to one another. This clock skewing logic permits the clock skew to change dynamically rather than statically, as in known systems. Moreover, the clock skewing logic limits the clock skew to be within a window of interest. As a result, the chance of a skewed data value being captured during the testing of the integrated circuit device is greatly increased.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for simulating asynchronous clock nets in an integrated circuit model, comprising:
   receiving the integrated circuit model;
   transforming at least one clock net in the integrated circuit model to include clock skewing logic, wherein the clock skewing logic introduces delay into the at least one clock net to thereby skew a phase of the at least one clock net with respect to another clock net in the integrated circuit model;
   simulating the integrated circuit model having the transformed at least one clock net, wherein the clock skewing logic comprises a delay counter and a plurality of latches, coupled to the delay counter, and provided in series, each latch introducing an additional delay amount to an input clock signal, wherein an output of a particular latch in the plurality of latches is selected as a clock output signal based on an incrementing of the delay counter with each enablement of the clock skewing logic, and wherein the clock skewing logic simulates an asynchronous operation of the at least one clock net with respect to the another clock net during the simulation of the integrated circuit model; and
   generating an output indicative of an operation of the integrated circuit model during the simulation.

2. The method of claim 1, wherein the clock skewing logic introduces delay amounts into the at least one clock net between a minimum phase shift amount and a maximum phase shift amount.

3. The method of claim 1, wherein the clock skewing logic includes enablement logic for enabling the clock skewing logic, and wherein the enablement logic comprises one of a user driven net or automatic enablement logic.

4. The method of claim 3, wherein the automatic enablement logic includes one of logic for periodically enabling the clock skewing logic or logic for randomly enabling the clock skewing logic.

5. A method, in a data processing system, for simulating asynchronous clock nets in an integrated circuit model, comprising:
   receiving the integrated circuit model;
   transforming at least one clock net in the integrated circuit model to include clock skewing logic, wherein the clock skewing logic introduces delay into the at least one clock net to thereby skew a phase of the at least one clock net with respect to another clock net in the integrated circuit model;
   simulating the integrated circuit model having the transformed at least one clock net, wherein the clock skewing logic simulates an asynchronous operation of the at least one clock net with respect to the another clock net during the simulation of the integrated circuit model; and
   generating an output indicative of an operation of the integrated circuit model during the simulation, wherein:
      the clock skewing logic introduces delay amounts into the at least one clock net between a minimum phase shift amount and a maximum phase shift amount,
      the clock skewing logic increases a delay amount introduced into the at least one clock net with each enablement of the clock skewing logic up to the maximum phase shift amount, and
      the clock skewing logic decreases a delay amount introduced into the at least one clock net with each subsequent enablement of the clock skewing logic following reaching the maximum phase shift amount.

6. A method, in a data processing system, for simulating asynchronous clock nets in an integrated circuit model, comprising:
   receiving the integrated circuit model;
   transforming at least one clock net in the integrated circuit model to include clock skewing logic, wherein the clock skewing logic introduces delay into the at least one clock net to thereby skew a phase of the at least one clock net with respect to another clock net in the integrated circuit model;
   simulating the integrated circuit model having the transformed at least one clock net, wherein the clock skewing logic simulates an asynchronous operation of the at least one clock net with respect to the another clock net during the simulation of the integrated circuit model; and generating an output indicative of an operation of the integrated circuit model during the simulation, wherein the clock skewing logic comprises a phase shift direction selection portion that determines whether to increase or decrease an amount of delay introduced into the at least one clock net.

7. The method of claim 6, wherein:

the phase shift direction selection portion asserts a signal along one of a plurality of select signal lines to a multiplexer, the multiplexer receives outputs from each latch in a plurality of latches provided in series such that each latch adds an incremental delay amount to an output signal from a previous latch in the plurality of latches or an input clock signal, and the multiplexer selects an output from a latch in the plurality of latches as an output clock signal based on the signal asserted by the phase shift direction selection portion.

* * * * *